Aug. 13, 1957 L. DERICK ET AL 2,802,760

OXIDATION OF SEMICONDUCTIVE SURFACES FOR CONTROLLED DIFFUSION

Filed Dec. 2, 1955

INVENTORS L. DERICK
C. J. FROSCH
BY
Arthur J. Torsiglieri
ATTORNEY 2,802,760

OXIDATION OF SEMICONDUCTIVE SURFACES FOR CONTROLLED DIFFUSION

Lincoln Derick, Colonia, N. J., and Carl J. Frosch, Summit, N. J., assignors to Bell Telephone Laboratories, Incorporated, New York, N. Y., a corporation of New York Application December 2, 1955, Serial No. 550,622

20 Claims. (Cl. 148—1.5)

This invention relates to the manufacture of semiconductive devices and more particularly relates to processes of manufacture which include the step of diffusing selected conductivity-type determining impurities into a semiconductive silicon body.

This application forms a continuation-in-part of our application Serial No. 477,535, filed December 24, 1954.

Diffusion is a technique which has become of considerable importance for the introduction of selected conductivity-type determining impurities into a semiconductive body to control the electrical properties of the body. Diffusion as used herein describes the introduction of a diffusant into a substrate without significant melting of the substrate. By way of contrast, fusion and alloying as used herein describe the introduction of an alloy agent into a substrate by melting at least a portion of the substrate for the mixing of the alloy agent and substrate.

The invention has special application to processes which involve vapor-solid diffusion in silicon where a solid silicon body is exposed to a vapor which includes a conductivity-type determining impurity in one of its oxidation states, including the elemental form, for the introduction of the conductivity-type determining impurity as the diffusant into the silicon body without significant melting of the silicon body. It will be convenient hereinafter to describe as a conductivity-type determining impurity any element or compound which includes a component which will serve either as an acceptor or as a donor in a semiconductive body.

Such vapor-solid diffusion has been found particularly advantageous for the formation of planar broad area p-n rectifying junctions close to the surface of a silicon body and so has proven advantageous for the formation of silicon bodies suitable for use as rectifiers of the kind described in copending application Serial No. 491,908, filed March 3, 1955, by G. L. Pearson, solar cells of the kind described in copending application Serial No. 414,273, filed March 5, 1954, by D. M. Chapin, C. S. Fuller and G. L. Pearson, now United States Patent 2,780,765 and junction transistors of the kind described in copending application Serial No. 516,674, filed June 20, 1955, by C. S. Fuller and M. Tanenbaum.

It has been found in practice that when a silicon body is heated to a high temperature, as is desirable in vapor-solid diffusion processes for keeping the diffusion time conveniently short, the surface of the silicon body often erodes or pits, resulting in a surface roughness. In vapor-solid diffusion processes such surface roughness is symptomatic of nonuniform penetration by the conductivity-type determining diffusant and, consequently nonuniform electrical properties of the surface, a factor which is undesirable for high quality units. Moreover, surface roughness ruins the surface for evaporation or other treatment which may be desirable as a subsequent step in the fabrication of particular devices. Such pitting generally appears to be the result of localized evaporation or uncontrolled oxidation of silicon over the surface of the body. Additionally, in vapor-solid diffusion processes, the pitting may be the result of localized surface alloying of the diffusant deposited on the body.

Additionally, in the practice of vapor-solid diffusion processes, it has often been found difficult to control, in the manner desired, the diffusion of the conductivity-type determining impurity over the surface of the body. In particular, for many applications, it is desirable to effect a lower diffusion preferentially over selected portions of the body.

The present invention has two principal aspects.

The first relates to minimizing the tendency of the surface of a silicon body to erode and pit when the body is subjected to high temperatures. By accomplishing this, it is made feasible to diffuse impurities into silicon at higher temperatures and shorter diffusion times than would otherwise be possible.

The second aspect relates to providing a control of vapor-solid diffusion processes whereby conductivity-type determining impurities may be diffused selectively over the surface of a semiconductive body.

A feature of the present invention is the formation of a suitable oxide film of prescribed characteristics over the surface of a silicon body. Such a film is found to enable the body to be heated to high temperatures with a minimum of deleterious effects to its surface in accordance with the first aspect of the invention. Additionally, in accordance with the second aspect, such a surface oxide film may be used for control in the vapor-solid diffusion into the body of selected conductivity-type determining impurities. The desired surface oxide film most advantageously is provided by heating the silicon body in the presence of a prescribed amount of water vapor. Alternatively, heating in the presence of other oxidizing agents may be employed to form the desired surface oxide film. In vapor-solid diffusion processes, the surface oxide film may be formed either by a separate heating operation before diffusion of the conductivity-type determining impurity or in the course of such diffusion.

In the previously identified application of which this forms a continuation-in-part, there is described a specific process for forming a silicon rectifier which includes the formation of a phosphosilicate glass on the surface for use as a mask. To this end, nitrogen is passed over phosphorus pentoxide ($P_2O_5$) maintained at between 200° C. and 230° C. and the resultant is flowed past and n-type silicon wafer maintained at 1200° C. for approximately twenty minutes whereby there is formed on the silicon body a phosphosilicate glass film and a shallow phosphorus-diffused region. This glass film and its underlying diffused region are removed over selected portions of the body. A mixture of nitrogen and boron trichloride ($BCl_3$) is then flowed past the body for two minutes while it is maintained at 1250° C. for forming a boron-rich surface film and a shallow boron-diffused region over portions of the body from which the phosphorous glass had been removed. It is characteristic that the unremoved phosphorous glass film will effectively mask underlying portions of the body from the boron. In particular, there is further disclosed the addition of a trace of water vapor in the boron trichloride mixture to act as a catalyst for the formation of a boron glass film on the surface portions free of the phosphorous glass film. The body is then heated for about sixteen hours at 1250° C. in an inert atmosphere for increasing the depth of penetration of the diffused phosphorus and boron. The end product is a structure suitable for use in a high power silicon rectifier.

It is to be noted that the deliberate formation of a surface oxide film in connection with the diffusion of impurities into the silicon body is believed at variance with prior art thinking on the subject. Generally, the prior art has regarded the formation of surface oxide films as an intermediate step as deleterious to the successful preparation of silicon devices of the kind now of interest. By surface oxide films is meant films of thickness greater than would be formed simply by exposing silicon to the atmosphere at room temperatures. For example, for the practice of the passivating aspect of the invention, it is generally advantageous to form an oxide layer at least 1000 Angstroms thick and preferably between 1500 and 3500 Angstroms thick.

In the process of the invention, the surface oxide film formed acts as a passivating mask which prevents not only uncontrolled oxidation of the underlying silicon but also surface pitting of the kind previously described when the silicon body is subjected to high temperatures in the course of diffusion. In addition, such an oxide film may be made to act selectively to moderate or control the diffusion of conductivity-type determining impurities. To this end, the surface oxide film protects the underlying silicon from all contaminants except those which are soluble in and diffuse readily through the surface oxide film and those which react with the surface oxide film to provide a reaction product which is soluble in and diffuses readily through the surface oxide film. Accordingly, the surface oxide film makes possible increased control of the diffusion process and particularly adds to the control over the depth of penetration of the diffusant and the concentration of the diffusant in the diffused regions. Moreover, such control permits the diffusion of impurities selectively over the surface of the body.

In particular, it is within the practice of the present invention to employ a surface oxide film over selected portions of a silicon body as a mask to restrict diffusion of impurities selectively at such portions. A surface oxide film of this kind is found uniquely suited for use as a mask. It is intimately bonded to the silicon body. It is stable with temperature. It is easy to form and easy to remove.

The invention finds special application in processes in which the vapor-solid diffusion is done in an open tube furnace, as is described in the previously identified parent application, in which a vapor including a carrier gas and the desired conductivity-type determining diffusant is flowed through the furnace and past the silicon wafer to be treated which is positioned in the furnace. In such an arrangement, for the practice of the invention, the carrier gas and the desired diffusant are chosen such that the carrier gas is effective as a carrier of the vapor of the diffusant and that the resultant which is formed will enable penetration of the oxide surface film by the desired diffusant to an extent consistent with the end sought.

In one illustrative embodiment typical of processes in which a surface oxide film is formed on the silicon body for use as a passivator by a separate heating operation before the introduction of any conductivity-type determining diffusant, a monocrystalline n-type silicon wafer was heated for approximately a half hour at 1200° C. in an atmosphere consisting essentially of hydrogen and a prescribed amount of water vapor. This resulted in an oxide surface film suitable for passivation. Thereafter for the diffusion of an acceptor impurity into the wafer for forming a p-n junction therein, the wafer was heated to 1200° C. for one hour in an atmosphere formed essentially by flowing water-laden hydrogen over gallium oxide ($Ga_2O_3$) kept at 1000° C. As a result of this treatment, there was formed a p-n-p structure free of surface deterioration.

In an alternative embodiment in which the surface oxide film was formed for use as a passivator in the course of the diffusion heating step, a p-type silicon wafer was heated for one hour at 1250° C. in an atmosphere formed essentially by flowing a prescribed mixture of hydrogen and water vapor over antimony oxide ($Sb_2O_5$) which was kept at 600° C. There was formed thereby an n-p-n structure free of surface deterioration.

In an embodiment which additionally made use of the moderating properties of a surface oxide film, a n-type silicon wafer was first heated in the presence of an oxidizing atmosphere formed by a mixture of nitrogen and water vapor for forming an oxide film on the surface of the body. Thereafter, the oxide film was removed from one of the two broad faces of the wafer by a hydrofluoric acid etch. The wafer was then reheated in the flow of the resultant formed by passing a mixture of nitrogen and water vapor over arsenic trioxide ($As_2O_3$) kept at 235° C. As a consequence of this treatment, there were formed without surface deterioration n-type zones on opposite faces of the wafer of which the one formed on the face from which the surface oxide film had been removed was deeper and of lower resistivity than the other.

In another embodiment of a process in which a surface oxide film was formed for use as a mask, an n-type silicon body was heated in an atmosphere formed by bubbling nitrogen through water to form a surface oxide film. This film was then removed from selected portions of the surface and the body was thereafter reheated in an oxidizing atmosphere including arsenic trioxide for the diffusion of an appreciable concentration of arsenic into the body only in regions where the original surface oxide film had been removed. Thereafter, the body was reheated again in a hydrogen-water-gallium oxide atmosphere for the diffusion of appreciable amounts of gallium over the surface of the body. Since gallium is a diffusant which was found not to be appreciably masked by a surface oxide film, this last step resulted in the diffusion of gallium uniformly over the body. It is also characteristic of gallium, as well as most acceptors, that at a given temperature it has a velocity of diffusion in silicon faster than arsenic, so that it can readily be made to penetrate deeper than the arsenic in the body even though heated for a shorter interval. Moreover, the solubility of gallium in silicon at a given temperature was found ordinarily to be lower than that of arsenic. As a consequence, the treatment recited resulted in the formation of an n-p-n-p structure free of surface deterioration. In this structure an n-type surface layer resulted because of the higher solubility of arsenic at the surface from which the original surface oxide film had been removed. The intermediate p-type zone resulted because of the deeper penetration of gallium stemming from its faster diffusion velocity. The intermediate n-type zone was the bulk material unaffected by any diffusion. The p-type surface layer resulted from the gallium diffusion into the surface where only little arsenic had penetrated because of the masking action to arsenic diffusion of the surface oxide film where it had not been removed.

Moreover, it is feasible to form first a shallow diffusion layer by heating the silicon body in essentially a nonoxidizing atmosphere including a conductivity-type determining impurity at a temperature sufficiently low that significant deterioration of the surface does not result and then to heat the body at a higher temperature in an oxidizing passivating atmosphere to increase the penetration of the diffused impurity into the body without the large amount of surface deterioration associated with high temperature heating. In an embodiment of this kind, a silicon body was heated for twenty minutes at 1000° C. in essentially a nonoxidizing atmosphere including the vapor of arsenic trioxide to form a shallow arsenic-diffused surface layer. This was then followed by heating for thirty minutes at 1300° C. in an atmosphere including water vapor without the large amount of surface deterioration usually accompanying high temperature heating. This subsequent heating served to increase substantially the depth of penetration of the arsenic into the body.

The various objects and features of the invention will be better understood from the following more detailed description, taken in conjunction with the accompanying drawing, in which.

Figure 1:
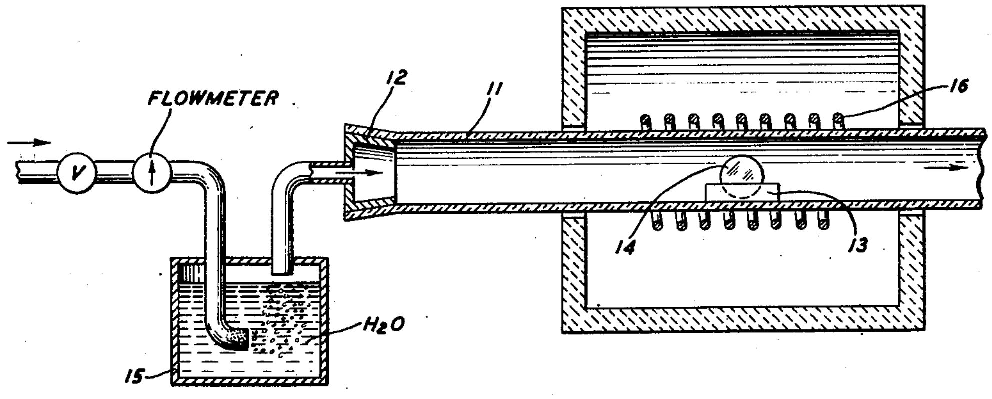
Fig. 1 shows schematically apparatus suitable for forming a surface oxide film on a silicon wafer as a separate heating operation in accordance with one step of an embodiment of the invention.

With reference now more particularly to the drawing, the apparatus of Fig. 1 includes an open furnace in the form of an elongated quartz tube 11. Typically, this quartz tube has an inner diameter of approximately one inch. In the drawing, the left hand end of the tube is shown as the input end. This end is provided with an inlet 12 by which a suitable oxidizing gas is passed therein for continuous flow towards the right hand, or outlet, end of the tube.

Intermediate along the tube's length, a quartz mount 13 supports the monocrystalline silicon wafer 14 which is to be treated. The silicon wafer is supported to expose most fully such portions of its surface in which diffusion of a conductivity-type determining impurity is most important. Preliminary to the treatment being described, it is, of course, important to lap and etch the surface of the wafer in the usual manner to remove any surface material which has been damaged in preparing the wafer to size and to provide a mirror smooth surface. Heating coils 16 surround that portion of the tube where the wafer is positioned to keep it at a suitable high temperature.

In the arrangement depicted the oxidizing atmosphere employed in the furnace is a mixture of a carrier gas, typically hydrogen, and water vapor which acts as the oxidant. For forming the mixture, a carrier gas from a supply source, after drying and purifying, is flowed at a rate which is under control of a valve and flowmeter, through a fritted glass bubbler 15 containing deionized water. Provision (not shown) is also made for controlling the temperature of the water whereby there is controlled the amount of water vapor in the mixture passing into the tube 11. Typically, the bubbler is immersed in a controlled temperature oil bath. The vapor pressure of the water vapor in the mixture is approximately (within 10 percent) the saturation value at the temperature of the oil bath. To insure against premature condensation of the water vapor in the mixture, provision (not shown) is also made to keep the temperature of the passage along which the mixture flows before reaching the silicon wafer above the temperature of the oil bath.

As will be discussed in greater detail hereinafter, for forming an oxide surface film suitable for passivating reliably the surface being treated, it is important that the content of water vapor in the mixture be sufficient to result in the formation of a continuous film of adequate thickness. However, it is important that the water vapor content of the mixture not be excessive both because silicon dioxide ($SiO_2$), which is generally the major component of the surface oxide film being formed, is soluble in large amounts of water vapor at the elevated temperatures being used and because it is necessary to insure that the formation of the surface oxide film will be sufficiently gradual to result in continuity and uniformity over the surface being treated. In particular, at the oxidizing temperatures most suitable which range between 1100° C. and 1400° C., it has been found advantageous to use a temperature range between 25° C. and 75° C. for saturating the carrier gas with water vapor to form the oxidizing atmosphere. After allowance is made for the fact that the carrier gas is not completely saturated with water vapor, this amounts to a partial pressure of water vapor in the range from about 20 to 250 millimeters of mercury. Additionally, a heating time of at least ten minutes under such conditions has been found desirable. In particular, temperatures of about 50° C. for the bath and 1250° C. for the body and a heating time of a half hour have generally been found preferable for forming a passivating surface oxide film. When the surface oxide film is used primarily as a mask, the primary consideration relevant to the thickness of the mask to be formed is the degree of masking action desired.

While water vapor is used as the oxidant in preferred embodiments of the invention, since its use has generally been found the most reliable and convenient, it is feasible to employ other oxidizing agents, such as dry oxygen. In such a case, controlled amounts of high purity oxygen are introduced into the tube and mixed with an inert carrier gas to form an oxidizing mixture. When oxygen is used as the oxidant, a carrier gas, such as nitrogen or helium, which will not react with oxygen should be used as the carrier gas.

Figure 2:
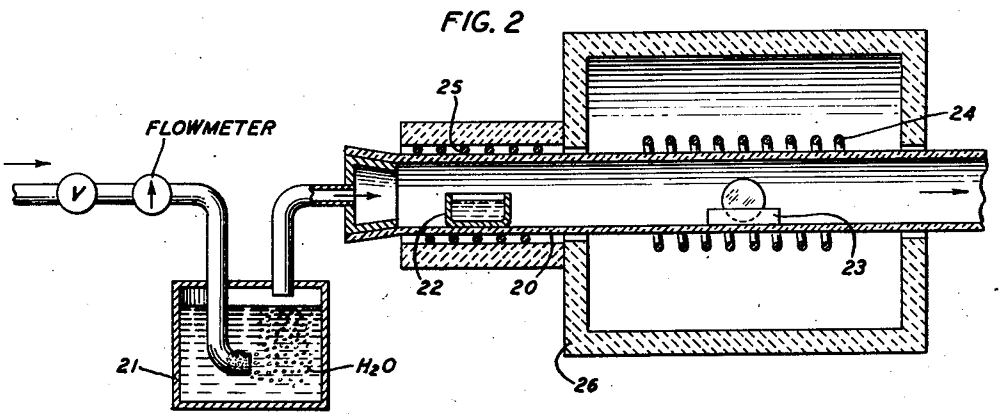
Fig. 2 shows schematically apparatus for forming a surface oxide film on a silicon wafer in the course of diffusion of a conductivity-type determining impurity in the body in accordance with another step in an embodiment of the invention.

Before discussing specific embodiments of the invention, it is thought desirable to describe also the apparatus shown in Fig. 2 which is typical of the apparatus used for the vapor-solid diffusion of conductivity-type determining impurities. In many respects, the apparatus is similar to that shown in Fig. 1 and actually it is feasible to employ the same apparatus both for preoxidation and for diffusion. However, in the interest of simplicity of exposition, separate apparatus are shown. The apparatus shown in Fig. 2 is adapted, however, for oxidation and diffusion in the same heating operation.

The apparatus shown in Fig. 2 resembles in many respects that shown in Fig. 1. An elongated tube 20 serves as the furnace and provision is made for the continuous flow of a carrier gas between the inlet and outlet ends of the tube. In the apparatus shown, the carrier gas applied to the inlet end is oxidizing and is formed by flowing a carrier gas through a bubbler 21, as in the apparatus shown in Fig. 1. As will be discussed below in more detail, for applications in which the wafer to be diffused has already been treated to form a surface oxide film, it is important that the mixture used for the vapor-solid diffusion operation at least be nonreducing and it is often desirable that it be oxidizing.

The apparatus shown in Fig. 2 differs from that shown in Fig. 1 principally by the inclusion of a source or supply 22 of a conductivity-type determining impurity in the tube positioned intermediate between the inlet end and the region where the silicon wafer to be treated is positioned. The carrier gas introduced at the inlet end is passed over this source so that impurity vapor may be picked up by the carrier and brought to the wafer. To fix the amount of impurity vapor added to the carrier mixture it is important to control the temperature of its source independent of the temperature at which the diffusion takes place. For this purpose, separate heaters 24 and 25 surround the regions of the positionings of the wafer and the source of the impurity, and heat shields 26 are interposed therebetween. To minimize condensation of the impurity vapor before it reaches the wafer, the temperature of the passage along which the mixture passes between the impurity source and the wafer is kept higher than that of the impurity source.

It is, of course, feasible to modify this apparatus for the introduction of controlled amounts of the impurity in vapor form from a suitable supply directly for mixing with the carrier gas for use in diffusion. Additionally, for some embodiments which utilize a nonoxidizing atmosphere including the vapor of a conductivity-type determining impurity, the apparatus shown may be modified for the flow of a nonoxidizing carrier past the impurity source or to supply an impurity vapor directly for mixture with such a carrier.

There will now be described various specific examples of the practice of the invention.

*First example*

A silicon p-n-p body was formed as follows:

A monocrystalline silicon wafer which was n-type with a specific resistivity of 5 ohm-centimeters and had previously been treated to have a mirror smooth surface free of damaged material, was positioned in a furnace of the kind illustrated in Fig. 1 and heated to 1200° C. There was introduced at the inlet end of the furnace at a rate of 1500 cubic centimeters per minute an oxidizing mixture comprising hydrogen which had been bubbled through deionized water maintained at 30° C. The hydrogen had first been purified by passing it through a catalytic unit which forms water of any oxygen present and the water formed was dried out by passing the mixture through a glass coil immersed in liquid nitrogen. The wafer was heated in the oxidizing atmosphere for thirty minutes for the formation on the body of a surface oxide film which had a thickness of about 2000 Angstroms.

Then for the diffusion of an acceptor impurity into the body, the wafer was removed from the first furnace and positioned in a furnace of the kind illustrated in Fig. 2 for heating to a temperature of 1200° C. An oxidizing mixture comprising hydrogen which after purifying and drying had been bubbled through water maintained at 30° C. was flowed at the rate of 1500 cubic centimeters per minute past a source of gallium oxide ($Ga_2O_3$) which was maintained at 1000° C., whereby gallium oxide vapor was added to the mixture for flow past the silicon wafer. The silicon wafer was positioned in the stream of the mixture formed for approximately twenty minutes whereby gallium was diffused into the body over its entire surface.

After this diffusion treatment, the wafer was removed from the furnace and given a hydrofluoric acid wash to remove the surface oxide film and the edges of the body were lapped to remove the diffused material from the edge regions for isolation of the two gallium-diffused faces.

The resultant wafer was on opposite broad faces p-type to a depth of approximately .24 mil with a surface sheet resistivity of approximately 700 ohms per square.

In particular, it was found that the surface oxide film formed in the first heating step had only a slight masking action on the penetration of the gallium in the subsequent diffusion heating step. In this example, the surface oxide film served primarily as a passivator and inhibited surface pitting and erosion during diffusion.

*Second example*

An n-p-n silicon body was also formed as follows:

A silicon wafer of p-type conductivity and 5 ohm-centimeters specific resistivity, after treatment to remove damaged surface material and to provide a mirror smooth surface, was positioned in a furnace of the type shown in Fig. 2 and heated to a temperature of 1200° C. For an hour the wafer was kept so positioned, during which time there was flowed past a mixture formed by passing over metallic antimony at 600° C. hydrogen which had first been purified and dried as previously described and then had been bubbled at a rate of 1500 cubic centimeters per minute through deionized water maintained at 30° C. In this example, a surface oxide film was formed during the heating step used for diffusion.

At the end of this heating operation, the wafer was removed from the furnace and then washed in hydrofluoric acid to remove the surface oxide film. After the antimony-diffused edges were lapped, there resulted an n-p-n body free from surface pitting and in which each of the n-type surface zones had a depth of .12 mil and a sheet resistivity of 200 ohms per square.

*Third example*

In a modification of the process described as the second example, nitrogen which had been first passed over copper heated to about 900° C. and then through a liquid nitrogen trap for purifying and drying was used in the place of hydrogen at the same flow rate as the original carrier in forming the mixture including water and antimony vapors and the wafer was heated to 1350° C. for an hour in the mixture formed. This resulted in a wafer free from surface pitting and in which each of the n-type surface zones was .40 mil thick and had a specific resistivity of 100 ohms per square.

*Fourth example*

As another example, a p-type silicon wafer having a specific resistivity of 5 ohm-centimeters was positioned in a furnace of the type shown in Fig. 1 and there heated to 1200° C. For an hour, an oxidizing mixture formed by bubbling dry purified nitrogen through deionized water kept at 50° C. was passed through the furnace. This resulted in the formation of an oxide film over the entire surface of the wafer.

Thereafter, the wafer was removed from the furnace and one face thereof coated with a wax which was resistant to hydrofluoric acid. The body was then washed in hydrofluoric acid to remove the surface oxide from the uncoated regions.

Then after removal of the wax coating and a wash in deionized water, the wafer was positioned in a furnace of the type shown in Fig. 2 and heated to 1300° C. The body was kept so positioned for thirty minutes during which time there was flowed past a mixture formed by bubbling dry purified nitrogen through deionized water kept at 50° C. and passing the wet nitrogen over arsenic trioxide ($As_2O_3$) kept at 235° C.

In this process the surface oxide film remaining on one face of the body serves a dual role. First, it plays its usual role as a passivator to prevent erosion of the surface. Additionally, it is found to act as a moderator, effectively slowing down the diffusion of arsenic into the underlying region of the body. In particular as a result of the treatment disclosed, after removal of the surface oxide film, it was found that on the surface where the original oxide film was not removed, the n-type zone formed by arsenic diffusion extended only to a depth of approximately .08 mil and had a sheet resistivity of 1200 ohms per square while on the opposite surface where the original oxide film had been removed before the arsenic diffusion step, the n-type zone formed by arsenic diffusion had a depth .15 mil thick and a sheet resistivity of about 240 ohms per square.

Accordingly, the ability of the surface oxide film to act as a moderator makes possible an additional degree of control in vapor-solid diffusion processes. In particular, the concentration and depth of penetration of a diffusant can be controlled by the preliminary formation of a surface oxide film of controlled depth. This is of importance in a process such as that described in application Serial No. 496,202, filed March 23, 1955, by G. C. Dacey, C. A. Lee and W. Shockley for the fabrication of diffused base junction transistors. In that process, it is important to avoid too high a concentration of the impurity diffusant in a surface zone formed by a vapor-solid diffusion in order to facilitate the later conversion of the conductivity type of such diffused surface.

Moreover, this moderating effect of a surface oxide film can be adopted for use in diffusion processes wherein diffusion is intended to effect a conversion in conductivity type of only selected portions of the surface of a body.

The process was repeated on a similar silicon wafer except that the temperature at which the water was kept was increased to 70° C. This resulted in decreasing the penetration of the n-type region into the face from which the surface oxide film was not removed to .03 mil and its sheet resistivity was increased to 4000 ohms per square.

*Fifth example*

As an example of the use of a surface oxide film to effect localized conductivity-type conversion, an n-type silicon wafer of 5 ohm-centimeters specific resistivity was positioned in a furnace of the type shown in Fig. 1 and heated for an hour at 1200° C. To form the oxidizing atmosphere present during such heating, nitrogen which had first been dried and purified was bubbled through deionized water maintained at 30° C. As a consequence of this step there was formed uniformly over the body a surface oxide film.

After removal of the body from the furnace, a row of wax strips were coated on one surface of the body to protect the underlying oxide film and then the body was washed in hydrofluoric acid to remove the surface oxide film from uncoated portions of the body. After such a wash, the wax strips were removed, and the wafer positioned in a furnace of the type shown in Fig. 2.

The wafer was then heated for one hour at 1200° C. in a furnace through which was flowed nitrogen which had been bubbled at a rate of 1500 cubic centimeters per minute through water kept at 30° C. and then passed over arsenic trioxide maintained at 235° C. This resulted in making those portions of the surface from which the surface oxide film had been removed heavily n-type and little affected those regions of the body underlying the strips of surface oxide film which had not been removed.

The body was thereafter removed from this furnace and reheated for twenty minutes to a temperature of 1200° C. in a furnace of the type shown in Fig. 2 through which was flowed hydrogen which had been bubbled through deionized water kept at 30° C. and then passed over gallium oxide maintained at 900° C. By this last operation, gallium was diffused substantially uniformly over the surface of the body since its diffusion was little affected by the surface oxide film. Moreover, because of its higher diffusivity rate the diffused gallium penetrated deeper into the body than did the previously diffused arsenic. However, because of the higher solubility of arsenic, those surface regions in which high concentration of arsenic had been diffused, corresponding to regions where the original surface oxide film had been removed, were little affected by the gallium diffused therein, the arsenic continuing to be predominant in determining the surface conductivity type. On the other hand, those regions of low arsenic concentration corresponding to surface regions where the original surface oxide film had not been removed were converted to p-type because the gallium had there become predominant.

Figure 3:
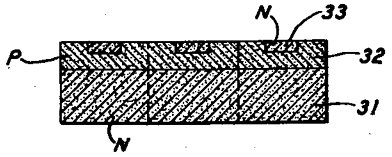
Fig. 3 shows schematically a multiunit structure formed in accordance with one embodiment of the invention.

After washing in hydrofluoric acid to remove the surface oxide film and removing the diffused material from the back face there resulted a body of the kind shown in cross section in Fig. 3. By appropriate slicing of this body, as shown by the dotted lines, there may be formed a plurality of n-p-n units, each of which includes an n-type zone 31, a p-type zone 32 and an n-type zone 33. The n-type zones 31 are formed by the original n-type material free of any diffused impurities. The n-type zones 33 are regions in which the concentration of the diffused arsenic exceeds the concentration of the diffused gallium. Such regions correspond to regions underlying the regions where the surface oxide film had been removed preliminary to the arsenic diffusion step. Each p-type zone 32 includes both a region where the gallium diffused penetrated beyond the region of arsenic diffusion because of its higher rate of diffusion and a region where the gallium concentration is higher than the arsenic concentration because of the masking effect on the arsenic diffusion of the surface oxide film which had not been removed before the arsenic diffusion step.

Each of these units is especially convenient for use as the semiconductive body in a junction transistor because it includes a surface p-type portion to which the connection to serve as the base electrode can conveniently be made.

It can be appreciated that surface layers of opposite conductivity type any shape or size may be formed on a silicon body by a modification of the process described. By locating a surface oxide film over all portions of the body except those where a change in conductivity type is desired and then heating the body under conditions such that significant diffusion of a conductivity-type determining impurity capable of converting the conductivity-type of the body takes place only where there was initially no surface oxide film, the desired end may be realized.

Moreover, the process just described may readily be modified to form a p-n-p-n structure free of surface deterioration. To this end, after formation of the oxide surface film as described, this film is removed completely from the back face of the body. There then follows in turn the arsenic diffusion step and the gallium diffusion step as previously described. At the front face where the original surface oxide film was not removed, the body will be p-type substantially to the depth of gallium diffusion, the gallium diffused overcompensating the little arsenic diffused. At the back face, the body will be n-type at the surface corresponding to the region of penetration of the arsenic which overcompensates the gallium there diffused. However, intermediate the arsenic-diffused surface zone there will be a p-type zone whose width corresponds to the difference in depth of penetration of the faster diffusing gallium and the slower diffusing arsenic.

*Sixth example*

It was also found possible to form a suitable surface oxide film by the use of oxidants other than water vapor. In another embodiment of the invention, a surface oxide film was formed on 5 ohm-centimeter n-type silicon wafer by heating it to a temperature of 1300° C. in a furnace of the kind described and then flowing therepast for half an hour dry oxygen at a rate of 1500 cubic centimeters per minute.

Then after removal of the wafer from the furnace one face thereof was washed with hydrofluoric acid for removal of the oxide film therefrom. Then the body was reheated to 1300° C. as previously described and there was flowed past for half an hour oxygen which had been passed over boron trioxide ($B_2O_3$) also kept at 1300° C. This resulted in the retention of an n-type surface where the surface oxide film had not been removed while the opposite face was converted to p-type to a depth of .76 mil with a sheet resistivity of 20 ohms per square. The resultant was a p-n structure free of surface deterioration.

*Seventh example*

A p-type silicon wafer of 5 ohm-centimeter resistivity was heated for a half hour at 1300° C. while dry oxygen was flowed therepast as described above. After removal of the surface oxide film formed from one face, the wafer was reheated to 1300° C. for a half hour while there was flowed past at the rate of 1500 cubic centimeters per minute dry oxygen which had been passed over arsenic trioxide kept at 235° C. This resulted in conversion to n-type of both faces without surface deterioration, but the n-type zone on the face from which the oxide film had been removed was .15 mil deep and of 200 ohms per square sheet resistivity while the opposite face was only .12 mil deep and had a sheet resistivity of 600 ohms per square.

*Eighth example*

For forming a p-n junction in a silicon wafer which was originally p-type and of 5 ohms-centimeter resistivity, the wafer was heated to 1000° C. for thirty minutes in a furnace basically of the type shown in Fig. 2 while there was flowed past a mixture formed by passing dry nitrogen directly over a source of arsenic trioxide which was kept at 235° C. at the same flow rate as had previously been described. This resulted in the formation of a shallow-arsenic-diffused surface layer over the body. Thereafter, for increasing the depth of penetration in a reasonable time without surface deterioration, the body was heated at a temperature of 1300° C. for a half hour in an oxidizing atmosphere formed by bubbling dry nitrogen through water kept at 50° C. in a furnace of the kind shown in Fig. 1. At the completion of this step, the surface oxide film formed by the second heating step was removed by washing in hydrofluoric acid. It was found unnecessary to add a conductivity-type determining impurity to the carrier during this high temperature heating step although such addition would be feasible and would result simply in a lower sheet resistivity for the surface. This treatment resulted in the formation of an n-p-n structure in which the n-type surface layers had a depth of .3 mil and a sheet resistivity of seventy ohms per square.

This technique of forming the initial shallow-diffused layer by heating in a nonoxidizing atmosphere at a temperature and for a time such that surface pitting is not serious and then following this up with heating at a higher temperature in an oxidizing atmosphere to increase the depth of diffusion to a desired value in conveniently short times without surface deterioration may be extended to any of the specific examples previously described. This technique is found to make for improved control since it does not involve simultaneously the formation of a surface oxide film and the initial introduction of the conductivity-type determining impurity into the body.

*Ninth example*

As a last example, for the formation of a p-n-p-n structure, a wafer of five ohm-centimeter n-type silicon was first treated in the manner previously described for the formation of a surface oxide film. This film was removed from one surface of the wafer and the wafer was then heated to about 950° C. for thirty minutes in an atmosphere formed by passing purified dry nitrogen over arsenic trioxide which was kept at 235° C. in a furnace essentially of the kind shown in Fig. 1 without provision for saturating the carrier gas with water vapor. Heating for this time at such a relatively low temperature was found not to cause any significant surface deterioration. After removal from the furnace, the wafer was washed lightly in hydrofluoric acid to remove the surface coating of arsenic. This last low temperature heating operation resulted in the formation of a shallow arsenic-diffused layer on the surface from which the surface oxide film had previously been removed and little affects the opposite surface. There then followed a second low temperature heating operation in which the wafer was heated to 900° C. for twenty minutes in an atmosphere formed by passing dry purified nitrogen over boron trioxide kept at 900° C. in a furnace like that used for the first low temperature operation. This heating step was also found not to cause any significant surface deterioration. After removal from the furnace, the wafer was given a light wash in hydrofluoric acid to remove the boron surface coating left. This last diffusion operation resulted in the introduction of boron to a shallow depth on both surfaces of the wafer. To increase the depth of penetration of the boron and arsenic diffusants introduced, the wafer was reheated to 1300° C. for thirty minutes in an oxidizing atmosphere formed essentially of nitrogen which previously had been bubbled through water kept at 30° C. in the manner shown in Fig. 1. This resulted in greatly increasing the diffusion depth of both the arsenic and boron previously diffused without surface deterioration. It is characteristic that boron has a diffusion velocity in silicon considerably higher than arsenic so that the boron penetrates appreciably deeper. However, it is characteristic that under the conditions described arsenic has a solubility in silicon higher than that of boron. As a consequence, at the surface corresponding to that where the surface oxide film originally formed had been removed before the arsenic diffusion step, there resulted a surface layer which was n-type because the arsenic there predominated and underlying it a p-type layer because the boron predominated. At the opposite surface, a p-type layer where boron predominated resulted because little arsenic had been diffused therein. The bulk interior remained n-type. Accordingly, there was formed a p-n-p-n structure free of surface deterioration.

It should be evident from the numerous illustrative examples described in detail that the principles of the invention may be embodied in a wide variety of forms. In particular, by appropriate choice of the variable parameters selective masking against either donor or acceptor impurities may be realized. Additionally, various sequences of steps may be employed. For example, there may be removal of surface film intermediate between a pair of diffusion steps. Accordingly, it is to be understood that various other embodiments may be devised by one skilled in the art without departing from the spirit and scope of the present invention. In particular, it is believed that the general principles described would be applicable to various other semiconductors, such as germanium and intermetallic group III–group V compounds by appropriate choice of parameters.

It is also evident that the process described may be readily adapted for continuous manufacturing techniques in which a succession of wafers are continuously moved through a succession of furnaces for the various heating operations.

What is claimed is:

1. The process of treating a semiconductive silicon wafer which comprises the steps of heating the wafer to between 1100° C. and 1400° C. in an oxidizing atmosphere which includes water vapor for at least ten minutes to form a surface oxide film thereover which is between 1500 and 3500 Angstroms thick, removing the surface oxide film from portions of the wafer, reheating the wafer to between 1100° C. and 1400° C. in an atmosphere including water vapor and the vapor of a conductivity-type determining impurity which will diffuse differentially in regions of the silicon body underlying portions where the surface oxide film was removed and in regions of the silicon wafer underlying portions where the surface oxide film was not removed, and reheating the wafer to between 1100° C. and 1400° C. in an oxidizing atmosphere including water vapor and the vapor of a conductivity-type determining impurity of the type opposite to the last-mentioned conductivity-type determining impurity for diffusion into the body.

2. The process of treating a semiconductive silicon wafer which comprises the steps of flowing past a silicon wafer which is kept at a temperature between 1100° C. and 1400° C. for at least a half hour a carrier gas which had been bubbled through water kept at a temperature between 25° C. and 75° C. for forming a surface oxide film on the wafer, subsequently flowing past the silicon wafer while it is kept at a temperature between 1100° C. and 1400° C. a carrier gas which had been bubbled through water kept at between 25° C. and 75° C. and then passed over arsenic trioxide for adding arsenic trioxide vapor to the gas and then flowing past the body while it is kept at a temperature of between 1100° C. and 1400° C. hydrogen which had been bubbled through water kept at between 25° C. and 75° C. and then passed over gallium oxide for adding gallium oxide vapor to the gas.

3. The process of treating a semiconductive silicon wafer which comprises the steps of heating the wafer in an oxidizing atmosphere to form thereon a surface oxide film, removing the surface oxide film from portions of the wafer, reheating the wafer in an oxidizing atmosphere including the vapor of a conductivity-type determining impurity which will diffuse differentially in regions of the silicon body underlying portions where the surface oxide film was removed and in regions of the silicon wafer underlying portions where the surface oxide film was not removed, and reheating the wafer in an oxidizing atmosphere including the vapor of a conductivity-type determining impurity of the type opposite to the last-mentioned conductivity-type determining impurity, the several heating steps resulting in a surface oxide film at least 1000 Angstroms thick on the wafer.

4. The process of treating a semiconductive silicon wafer which comprises the steps of heating the wafer in an oxidizing atmosphere to form thereon a surface oxide film at least 1000 Angstroms thick, removing the surface oxide film from portions of the wafer, reheating the wafer in an oxidizing atmosphere including the vapor of a conductivity-type determining impurity which will diffuse differentially in regions of the silicon body underlying portions where the surface oxide film was removed and in regions of the silicon wafer underlying portions where the surface oxide film was not removed, and reheating the wafer in an oxidizing atmosphere including the vapor of a conductivity-type determining impurity of the type opposite to the last-mentioned conductivity-type determining impurity.

5. The process of treating a semiconductive silicon wafer which comprises the steps of heating the wafer in an oxidizing atmosphere to form a surface oxide film thereover, removing the surface oxide film from portions of the wafer, reheating the wafer to between 1100° C. and 1400° C. in an oxidizing atmosphere including the vapor of a conductivity-type determining impurity, and reheating the wafer to between 1100° C. and 1400° C. in an oxidizing atmosphere including the vapor of a conductivity-type determining impurity of the type opposite to the last-mentioned conductivity-type determining impurity, the several heating steps providing a surface oxide film at least 1000 Angstroms thick on the wafer.

6. The process of treating a semiconductive silicon wafer which comprises the steps of heating the wafer in an oxidizing atmosphere to form thereon a surface oxide film at least 1000 Angstroms thick, removing the surface oxide film from portions of the wafer, reheating the wafer to between 1100° C. and 1400° C. in an oxidizing atmosphere including the vapor of a conductivity-type impurity, and reheating the wafer to between 1100° C. and 1400° C. in an oxidizing atmosphere including the vapor of a conductivity-type determining impurity of the type opposite to the last-mentioned conductivity-type determining impurity, whereby the surface of the wafer includes portions of different conductivity types.

7. The process of treating a semiconductive silicon wafer which comprises the steps of heating the wafer in an oxidizing atmosphere to form thereon a surface oxide film, removing the surface oxide film from portions of the wafer and reheating the wafer in an atmosphere including an impurity capable of converting the conductivity-type of the wafer and which will diffuse differentially in regions of the silicon wafer underlying portions where the surface oxide film was removed and in regions of the silicon wafer underlying portions where the surface oxide film was not removed, the several heating steps providing a surface oxide film at least 1000 Angstroms thick on the wafer.

8. The process of treating a semiconductive silicon wafer which comprises the steps of heating the wafer in an oxidizing atmosphere to form thereon a surface oxide film at least 1000 Angstroms thick, removing the surface oxide film from portions of the wafer, and reheating the wafer in an atmosphere including an impurity which is capable of converting the conductivity-type of the wafer and which will diffuse differentially in regions of the silicon wafer underlying portions where the surface oxide film was removed and in regions of the silicon wafer underlying portions where the surface oxide film was not removed, whereby regions of the surface of the wafer are of opposite conductivity type.

9. The process of treating a semiconductive silicon wafer which comprises the steps of heating the wafer in an oxidizing atmosphere to form a passivating surface oxide film thereover at least 1000 Angstroms thick and reheating the wafer to between 1100° C. and 1400° C. in an oxidizing atmosphere including the vapor of a conductivity-type determining impurity for diffusing the impurity into the body for converting the conductivity type of surface portions of the body.

10. The process of treating a semiconductive silicon wafer which comprises the steps of heating the wafer to between 1100° C. and 1400° C. in an oxidizing atmosphere which includes water vapor to form a passivating surface oxide film thereover and then reheating the wafer to between 1100° C. and 1400° C. in an oxidizing atmosphere including water vapor and the vapor of a conductivity-type determining impurity for diffusing the impurity into the wafer, the several heating steps providing a surface oxide film at least 1000 Angstroms thick.

11. The process of treating a semiconductive silicon body which includes the step of heating the body to a temperature between 1100° C. and 1400° C. in an atmosphere including the vapor of an impurity capable of converting the conductivity-type of the body and the resultant of bubbling a nonreducing carrier gas through water kept at a temperature between 25° C. and 75° C. whereby a surface layer of opposite conductivity type and a surface oxide film at least 1000 Angstroms thick are formed on the body.

12. The process of treating a semiconductive silicon body which includes the step of heating a silicon body in the presence of an oxidizing atmosphere which includes both water vapor and the vapor of a conductivity-type determining impurity for converting the conductivity type of a surface portion of the body and for forming an oxide layer at least 1000 Angstroms thick on the body.

13. The process of treating a silicon body which includes the process of heating the silicon body to a temperature between 1100° C. and 1400° C. and passing a non-reducing carrier gas which has been bubbled through water kept at a temperature between 25° C. and 75° C. in turn, over a source of conductivity-type determining impurities and the heated silicon body for diffusing the impurity into the surface of the body and for forming an oxide layer at least 1000 Angstroms thick on the body.

14. The process of treating a semiconductive silicon body which includes the process of heating a silicon body between 1100° C. and 1400° C. in the presence of oxygen until there is formed on the surface of the silicon body a surface oxide film at least 1000 Angstroms thick and then reheating the body between 1100° C. and 1400° C. in the presence of a conductivity-type determining impurity for its diffusion into the body.

15. The process of treating a silicon body which includes the step of heating the body in an oxidizing atmosphere to form a surface oxide film over the body between 1500 and 3500 Angstroms thick, removing the surface oxide film from portions of the surface of the body and reheating the body in an atmosphere including an impurity capable of converting the conductivity-type of the surface of the body and which will diffuse to different degrees in regions of the body underlying the remaining surface oxide film and in regions free of the surface oxide film.

16. The process of treating a silicon body comprising the steps of heating the body in an oxidizing atmosphere for forming a passivating surface oxide film between 1500 and 3500 Angstroms thick on the body and then heating the body in an atmosphere including a conductivity-type impurity for diffusing the impurity into the body.

17. The process of treating a semiconductive silicon body at a temperature below 1100° C. comprising the steps of heating the body in an atmosphere which includes the vapor of an impurity capable of converting the conductivity-type of the body to form a shallow diffused layer of opposite conductivity type on the surface of the body and then heating the body in an oxidizing atmosphere in a range between 1100° C. and 1400° C. for increasing the depth of penetration of said layer of opposite conductivity type and for forming an oxide layer at least 1000 Angstroms thick on the body.

18. The process of treating a semiconductive silicon body comprising the steps of heating to a temperature below 1100° C. the body in a substantially nonoxidizing atmosphere which includes an impurity capable of converting the conductivity type of the body for forming a shallow diffused layer of opposite conductivity type and then reheating the body to a temperature above 1100° C. in an oxidizing atmosphere to increase the depth of penetration of the layer of opposite conductivity type and for forming an oxide layer at least 1000 Angstroms thick on the body.

19. The process of forming a rectifying barrier in a silicon body which comprises the step of heating the silicon body in an oxidizing atmosphere which includes the vapor of a conductivity-type determining impurity for a time and at a temperature for forming both a surface oxide film at least 1000 Angstroms thick and a surface layer of the opposite conductivity type on the body.

20. The process of forming a rectifying barrier in a silicon body which comprises the steps of heating the silicon body in an oxidizing atmosphere substantially free of conductivity-type determining impurities for forming a continuous surface oxide film thereover at least 1000 Angstroms thick and thereafter reheating the body in an atmosphere which includes the vapor of a conductivity-type determining impurity for forming a surface layer of opposite conductivity-type in the body.

References Cited in the file of this patent

UNITED STATES PATENTS

| | | |
|---|---|---|
| 2,485,069 | Scaff et al. | Oct. 18, 1949 |
| 2,583,681 | Brittain | Jan. 29, 1952 |
| 2,683,676 | Little et al. | July 13, 1954 |